(12) United States Patent
Guichard et al.

(10) Patent No.: US 9,899,596 B2
(45) Date of Patent: Feb. 20, 2018

(54) METHOD FOR PRODUCING A SEMICONDUCTING ORGANIC FILM

(71) Applicant: ARMOR, Nantes (FR)

(72) Inventors: Pierre Jean Yves Guichard, Saint Philbert de Grandlieu (FR); Christophe Derennes, Saint Philbert de Grandlieu (FR)

(73) Assignee: ARMOR, Nantes (FR)

(*) Notice: Subject to any disclaimer, the term of this patent is extended or adjusted under 35 U.S.C. 154(b) by 211 days.

(21) Appl. No.: 14/747,806

(22) Filed: Jun. 23, 2015

(65) Prior Publication Data

US 2015/0372232 A1    Dec. 24, 2015

(30) Foreign Application Priority Data

Jun. 24, 2014 (FR) .................... 14 55832

(51) Int. Cl.
*H01L 51/00*    (2006.01)
*H01L 51/42*    (2006.01)

(52) U.S. Cl.
CPC ...... *H01L 51/0003* (2013.01); *H01L 51/0004* (2013.01); *H01L 51/42* (2013.01); *H01L 51/4253* (2013.01); H01L 51/0036 (2013.01); H01L 51/0038 (2013.01); H01L 51/0047 (2013.01); H01L 51/0074 (2013.01); H01L 51/0094 (2013.01); Y02E 10/549 (2013.01); Y02P 70/521 (2015.11)

(58) Field of Classification Search
CPC ........................... H01L 51/0002; H01L 51/42
See application file for complete search history.

(56) References Cited

U.S. PATENT DOCUMENTS

| | | |
|---|---|---|
| 2006/0180199 A1 | 8/2006 | Lenhard et al. |
| 2012/0043529 A1* | 2/2012 | Uetani .................. B82Y 10/00 257/40 |
| 2014/0167002 A1 | 6/2014 | Welch et al. |

OTHER PUBLICATIONS

Wim Geens et al., "The Advantages of Vacuum Deposition as a Technique to Grow Ppv-oligomer/C60 Thin Films for Organic Solar Cell Applications," International Society for Optical Engineering, 1999, pp. 1246-1249, vol. 3975).*

J. Zhang et al., "Conjugated Polymer-Small Molecule Alloy Leads to High Efficient Ternary Organic Solar Cells", J. Am. Chem. Soc., 2015, 137, 8176-8183.*

(Continued)

*Primary Examiner* — Daniel Whalen
*Assistant Examiner* — Suberr Chi
(74) *Attorney, Agent, or Firm* — Thompson Coburn LLP; Steven M. Ritchey

(57) ABSTRACT

A method for producing a semiconducting organic film comprising the steps:
  preparing a first mixture comprising a first organic semiconducting material of type p having a molar mass of less than or equal to 2,000 g·mol$^{-1}$ and a first organic semiconducting material of type n having a molar mass of less than or equal to 2,000 g·mol$^{-1}$,
  adding a second organic semiconducting material to the first mixture to form a second mixture, wherein the second organic semiconducting material is one or more polymers having a molar mass greater than or equal to 10,000 g·mol$^{-1}$, and
  forming the organic film from the second mixture.

14 Claims, 1 Drawing Sheet

(56) References Cited

OTHER PUBLICATIONS

Geens et al., The Advantage of Vacuum Deposition as a Technique to Grow PPV-Oligomer/C60 Thin Films for Organic Solar Cell Applications, International Society for Optical Engineering, Dec. 14, 1999, pp. 1246-1249, vol. 3975.

Huang et al., "A Ternary Cascade Structure Enhances the Efficiency of Polymer Solar Cells", Journal of Materials Chemistry, 2010, pp. 2820-2825, vol. 20.

* cited by examiner

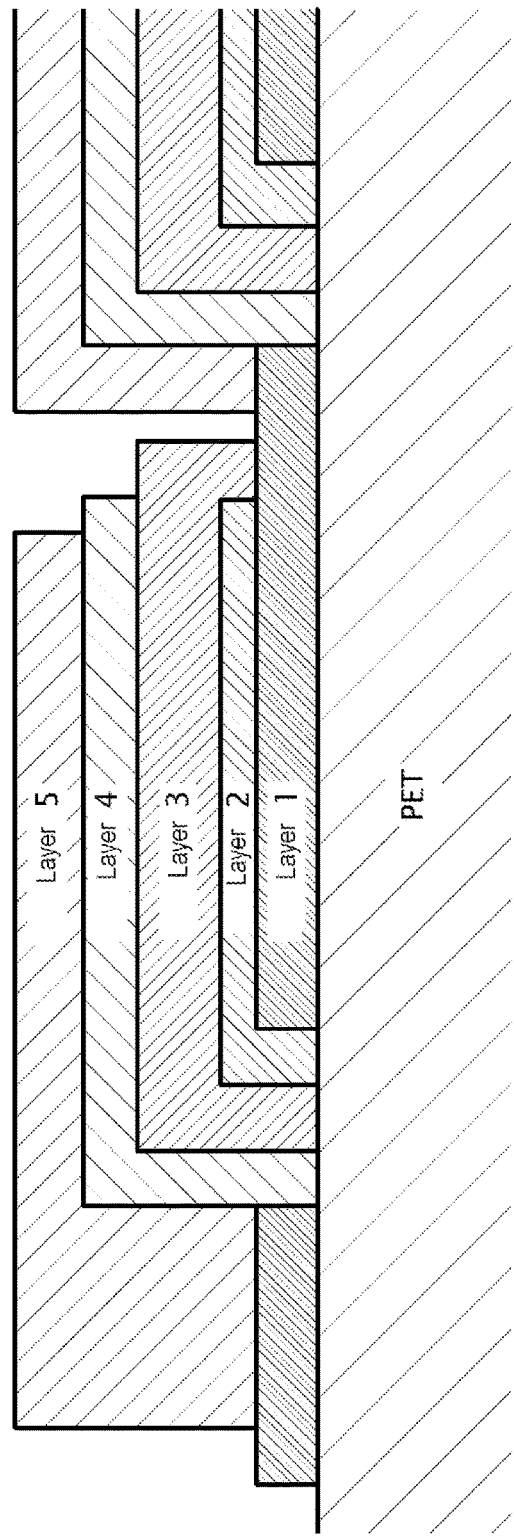

METHOD FOR PRODUCING A SEMICONDUCTING ORGANIC FILM

CROSS-REFERENCE TO RELATED APPLICATIONS

This application is claims the benefit of French Application No. 14 55832, filed Jun. 24, 2014, which is incorporated herein by reference in its entirety.

FIELD OF THE INVENTION

The present invention relates to a method for producing an organic film, to a use of an organic film obtained by applying the production method to a photovoltaic cell including an active layer coated with the organic film, to a photovoltaic module consisting of photovoltaic cells and to a method for manufacturing the active layer of a photovoltaic cell of a photovoltaic module.

BACKGROUND OF THE INVENTION

A photovoltaic cell is an electronic component which, exposed to light (photons), produces electricity by means of the photovoltaic effect which is at the origin of the phenomenon. The obtained current is related to the incident light power. The photovoltaic cell delivers a DC voltage.

An organic photovoltaic cell is a particular photovoltaic cell. In this case, at least the active layer consists of organic molecules. Consequently, the photovoltaic effect is, for a photovoltaic cell, obtained by means of the properties of semiconducting materials.

By the expression of "semiconductor" is meant a material which has the electrical characteristics of an insulator, but for which the probability that an electron may contribute to an electric current, although small, is non-negligible. In other words, the electric conductivity of a semiconductor is intermediate between the electric conductivity of metals and the electric conductivity of insulators.

The behavior of semiconductors is described by quantum physics by using an approximation with band theory. The approximation with band theory stipulates that an electron in a semiconductor can only assume energy values comprised in continuous intervals called "bands", more specifically permitted bands, which are separated by other "bands" called forbidden energy bands or forbidden bands.

Two permitted energy bands play a particular role: the last completely filled band, called a "valence band" and the next permitted energy band called a "conduction band." In a semiconductor, like in an insulator, the valence band and the conduction band are separated by a forbidden band, currently designated by its shorter English equivalent "gap." The unique difference between a semiconductor and an insulator is the width of this forbidden band, a width which gives each of them its respective properties. The width of the forbidden band is often characterized in energy, this energy corresponding to the energy to be provided to an electron so that the electron passes from the valence band to the conduction band.

A semiconductor is a semiconductor of type p when the semiconductor comprises chemical elements with a valency different from the valency of the atoms of the semiconductor and increasing the concentration of holes in the valence band. Such a semiconductor is also-called a p-doped semiconductor or an electron donor.

A semiconductor is a type n semiconductor when the material comprises chemical elements with a valency different from the valency of the atoms of the semiconductor and increasing the hole concentration in the conduction band. Such a semiconductor is also-called an n-doped semiconductor or electron acceptor.

Further, a semiconductor is considered as organic as soon as the semiconductor comprises at least one bond being part of the group formed by covalent bonds between a carbon atom and a hydrogen atom, covalent bonds between a carbon atom and a nitrogen atom, or further bonds between a carbon atom and an oxygen atom.

Further, in the case of an organic semiconductor, the approximation with band theory is no longer valid but by analogy, molecular orbitals have the same behavior, the HO orbital corresponding to the valence band and the VB orbital to the conduction band. The HO (acronym for "high occupied") orbital is also designated in English terminology by HOMO (acronym for "highest occupied molecular orbital") orbital and designates the highest energy molecular orbital occupied by at least one electron. The LU (acronym for "lowest unoccupied") orbital is also designated in English terminology by LUMO (acronym for "lowest unoccupied molecular orbital") orbital and designates the lowest energy orbital not occupied by an electron.

Thus, organic semiconductor materials have a forbidden band, the width of which delimits the minimum energy to be provided to an electron for having it pass from a fundamental state to an excited state. The energy for example is provided as light energy. Such a photovoltaic cell is often designated by its acronym OPV for "organic photovoltaic."

The organic photovoltaic cell thus comprises an active layer. The active layer has a hetero-junction structure obtained by mixing in the bulk, an electron donor material and an electron acceptor material. In this context, an electron donor material is a semiconducting material of type p while an electron acceptor material is a semiconducting material of type n.

A film is a homogenous and continuous layer made in a material or a mixture of materials having a relatively small thickness. By a relatively small thickness is meant a thickness of less than or equal to 500 microns.

A film may also be characterized by its homogeneity and notably the homogeneity of its thickness over the whole of its surface, its aspect (the presence of a de-wetting point, of a drying gradient, and other defects), its roughness and the resolution of the borders of the film (or contours of the film).

Generally, the characteristics of a film depend on several types of factors related to: the technique used for forming the film; the deposited solution (the deposited amount, its wettability on the substrate, its viscosity); to the materials used (their concentrations, their ratios and their solubilities in the solvent, their molar masses).

A film may be formed by means of a wide range of techniques which may be used for forming the different layers of an organic photovoltaic cell such as printing methods (flexography, heliography, heliogravure, offset printing, ink jet printing, etc.) and coating methods (slot-die, curtain coating, knife coating, etc.).

The spin coating technique is the most used for studying the characteristics of organic photovoltaic cells. Centrifugal deposition also-called spin coating is a very widespread method for depositing a thin layer on a planar surface. This method consists of depositing a drop on a rotating plate, the drop then being spread out by centrifugation, in order to form a layer.

The formed film thickness depends on factors related to how the method is applied like angular velocity (the greater it is, the thinner will be the thickness), the acceleration (the greater it is, the thinner will be the thickness) or the operating period (the longer takes the operation, the thinner is the formed film to a lesser extent).

Alternatively, a dip-coating method may be used for forming the film. This technique is based on a principle similar to centrifugal coating. But, in this case, the substrate is soaked in the solution and is removed with a controlled velocity and angle.

Alternatively, another method said to be a "doctor blading" method may be used. According to this method, a razor blade undergoes translation at a defined distance from the substrate with the purpose of spreading out the organic material. With the deposited volume, the translation velocity and the height of the blade, it is possible to define the final thickness of the film.

These manufacturing methods are however not compatible with large scale production which should preferably be carried out by means of continuous processes such as unrolling methods more known under the name of roll-to-roll (noted as R2R in the continuation of the description).

On the other hand, the manufacturing of a photovoltaic module requires observance of a certain number of conditions. An organic photovoltaic module is an assembly comprising at least two distinctive photovoltaic cells close to each other and connected in series or in parallel. The formation of an organic photovoltaic assembly requires deposition of film strip patterns superposed on a substrate, for example strips with a width comprised between 9.5 mm and 13.5 mm have to be separated by an interband area with a width comprised between 0.5 mm and 4.5 mm, the total width of the band and of the interband area being 14 mm. A module consists of the deposition of several layers by various coating or printing methods as illustrated in the Figure which is a sectional view of an organic photovoltaic module.

From among the conditions to be observed, mention may be made of design, structuration, an exact geometry to within one millimeter of the photovoltaic cells at the intermediate area between each cell where the latter are electrically connected with each other, most deposition techniques are unsuitable since they are incompatible with forming strip patterns.

The R2R deposition processes in the liquid state are divided into various categories: the printing methods allow generation of high resolution patterns and the coating methods result from deposition of material over a full width or a solid surface without any pattern.

The methods contemplated for industrial manufacturing of large surface modules are therefore printing techniques such as screen printing, flexography or deposition by an ink jet or pre-metered coating methods such as so-called slot-die, slide coating and curtain coating methods (compatible with more complex coating heads allowing the design of the film strip). Such methods are notably described in the article of Roar Sondergaard et al. entitled "Roll-to-roll fabrication of polymer solar cells" published in the journal, Materials Today of January-February 2012, Volume 15, Number 1-2.

Each of the coating and/or printing methods operates better for specific viscosities, most printing methods requiring high viscosity inks. Perfectly optimized inks may produce sought resolutions and specificities such as the example described in the article of Christoph Brabec et al. entitled "Solution-Processed Organic Solar Cells" published in the journal Materials Research Society Bulletin of July 2008, volume 33.

The goal of our research is the development of low cost, flexible photovoltaic modules by means of roll-to-roll printing and/or coating technologies. In order to attain these goals, the inks having the required properties are to be formulated and the suitable deposition method for this ink is to be selected. The influence of the parameters of the method on the properties of the layer is to be determined. The influence of the drying conditions on the properties of the layer, like the morphology and uniformity, is to be analyzed.

The active layer is coated/printed from a mixture of materials in solution, for which the viscosity, the wettability of the solution on the substrate are parameters to be controlled depending on the materials and on the coating methods used. From among the mixtures in solution usually considered for forming the active layer of a photovoltaic cell, the mixing of poly(3-hexylthiophene) also noted as P3HT with methyl[6,6]-phenyl-C61-butanoate also noted as PCBM is often studied. P3HT is the semiconducting material of type p and PCBM is the semiconducting material of type n.

P3HT is a conjugate polymer which exhibits interesting film-forming properties but polymers are also generally more difficult to synthesize and to purify than small molecules, limiting their appeal in industrial settings and their use at a large scale.

Motivated by the reproducibility of the synthesis of small molecules, research groups conducted studies, for example presented in the article of Bright Walker et al. "Small Molecule Solution-Processed Bulk Heterojunction Solar Cells" published in the journal Chemistry of Materials—Volume 23, Number 3, molecular donor materials allowing high performance, notably strong absorption of light, good photochemical stability. Their relatively compact structures including a few simple synthesis steps make them promising materials for mass production of organic photovoltaic modules.

However, when two low molecular weight materials are deposited in order to form a hetero-junction layer, these materials do not form interpenetrated lattices as observed with polymers. The films obtained from such materials are difficult to produce industrially notably because of their relatively poor solubility or wettability.

Therefore there exists a need for a method for producing an organic film giving the possibility of obtaining an organic film having better properties, for example in terms of homogeneity, roughness and definition of the contours.

SUMMARY OF THE INVENTION

For this purpose, a method for producing a semiconducting organic film is proposed, comprising steps for preparing a first mixture comprising a first organic semiconducting material of type p having a molar mass of less than or equal to 2,000 grams·mol$^{-1}$ and a first organic semiconducting material of type n having a molar mass of less than or equal to 2,000 grams·mol$^{-1}$. The production method also includes a step for adding to the first mixture a second organic semiconducting material in order to form a second mixture, the second material being a polymer having a molar mass greater than or equal to 10,000 g·mol$^{-1}$, and a step for forming the organic film from the second mixture.

According to particular embodiments, the production method comprises one or more of the following features, taken individually or according to any technically possible combination:

the second material is an organic semiconducting polymer of type n.

in the second mixture, the mass ratio between the second semiconducting material and the first organic semiconducting material of type n is comprised between 0.8 and 1.2.

the second material is an organic semiconducting polymer of type p.

in the second mixture, the mass ratio between the second semiconducting material and the first organic semiconducting material of type p is comprised between 0.8 and 1.2.

in the second mixture, the mass ratio between the assembly of the second material and of the first organic semiconducting material of type n on the one hand and the organic semiconducting material of type p on the other hand is comprised between 0.8 and 1.2.

in the preparation step, the first mixture also includes a solvent or a mixture of solvents.

the second mixture is more soluble than the first mixture.—the second mixture has a viscosity of more than 2 mPa·s, preferably greater than 3 mPa·s, the formation step is applied by using one of the following techniques:
a coating or printing technique,
a coating or printing technique by unrolling a so-called roll-to-roll technique,
a slot-die coating technique,—a screen printing method,
a flexographic method, and
an inkjet method.

The use of the method of a semiconducting organic film as described earlier is also proposed for producing strips of semiconducting organic film.

An organic film produced from the production method as described earlier is also proposed.

An organic photovoltaic cell is also proposed, including an active layer produced by coating an organic film as described earlier.

An organic photovoltaic module is also proposed, including a cell produced by coating an organic film as described earlier.

A method for manufacturing an active layer of an organic photovoltaic cell of a photovoltaic module is also proposed, comprising steps for providing a substrate, and for coating the substrate with organic film strips obtained by the use as described earlier.

BRIEF DESCRIPTION OF THE DRAWING

The FIGURE is a sectional view of an organic photovoltaic module.

DETAILED DESCRIPTION OF THE PREFERRED EMBODIMENTS

A method for producing a semiconducting organic film is proposed.

The production method includes a step for preparing a first mixture.

The first mixture includes an organic semiconducting material of type p and a first organic semiconducting material of type n.

The first organic semiconducting material of type n has a molar mass of less than or equal to 2,000 g·mol$^{-1}$.

Advantageously, the semiconducting material of type n is selected from the list consisting of:
fullerene,
methyl[6,6]-phenyl-C61-butyrate (also noted as PC60BM),
[6,6]-phenyl C61-butyric acid methyl ester (C60-PCBM),
[6,6]-phenyl C71-butyric acid methyl ester (C70-PCBM),
bis(1-[3-(methoxycarbonyl)propyl]-1-phenyl)[6.6]C62 (Bis-C60-PCBM),
3'-Phenyl-3'H-cyclopropa[8,25][5,6]fullerene-C70-bis-D5h(6)-3'-butanoic acid methyl ester (Bis-C70-PCBM),
indene-C60-bisadduct (ICBA) and
mono indene nil C60 (ICMA).

Preferably, the semiconducting material of type n is PC60BM.

The first organic semiconducting material of type p has a molar mass of less than or equal to 2,000 g·mol$^{-1}$.

Advantageously, the first organic semiconducting material of type p is selected from the list consisting of DTS-(FBTTH2)2, IBTP, IDF, DTS-(PTTH2), boro-dipyromethene, diketopyrrolopyrrole, oligothiophene, indigo, quinacridone, merocyanin, squarain and so-called "push-pull" compounds. A so-called "push-pull" compound is an assembly of a so-called push group with a so-called pull group via a π bond. A carbazole group or a triphenylamine group are so-called push group examples. A dicyanovinylene or benzothiadiazole group are so-called pull group examples. The π bond is for example applied by means of a thiophene, of a phenyl or of a vinyl. The dithienosilol is a so-called "push-pull" compound example.

According to a preferred embodiment, the first organic semiconducting material of type p is DTS-(FBTTH2)2.

Preferably, the first mixture is prepared in the presence of a solvent.

Advantageously, the solvent is non-halogenated.
Advantageously, the solvent is non-chlorinated.
Preferentially, the solvent is non-toxic.
Preferably, the solvent is compatible with the use of a thermal drier, i.e. the self-inflammation point is above 200° C. This gives the possibility of contemplating the use of the solvent in an industrial context, while observing the health of the co-workers and the environment.

As an example, the solvent is selected from a list consisting of dimethyl sulfoxide (also noted as DMSO), acetone, tetrahydrofurane (also noted as THF), methyl ethyl ketone (also noted as MEK), toluene, propylene glycol, cyclohexane, 2-butanol, cyclohexanone, 2-propanol, methylisobutylketone (also noted as MIBK), acetophenone, methyl isopropyl ketone, dimethyl ethanolamine, methyl n-propyl ketone, ethylene glycol, o-xylene, 1-methyl-naphthalene, 3-methylthiophene, nonane, anisole, ethylcyclohexane, 2-ethyl-hexanol, indane, dodecane, 1,2-hexanediol, 1-butanol, thiodiethylene glycol, dimethyl glutarate, dimethyl succinate, ethylene glycol diacetate, dipropylene glycol monomethyl ether, diethylene glycol, methyl cyclohexane, mesitylene, aniline, benzaldehyde, acetonitrile, p-xylene or m-xylene.

At the end of the application of the preparation step, a first mixture is obtained including the organic semiconducting material of type n and the organic semiconducting material of type p.

The production method also includes a step for adding to the first mixture a polymer in order to form a second mixture.

A polymer is a chain consisting of a number of monomeric units which are repeated.

According to an embodiment, the polymer is an organic semiconducting polymer of type p.

According to another embodiment, the polymer is an organic semiconducting polymer of type n.

In the following, the second organic semiconducting material is simply designated under the name of "polymer."

The second semiconducting material is a photoactive material.

The polymer has a molar mass greater than or equal to 10,000 g·mol$^{-1}$

Advantageously, the organic semiconducting polymer of type p is selected from the list consisting of polythiophene, poly(alkyl-3-thiophene) in which the alkyl group has 6 to 16 carbon atoms, poly(3-hexylthiophene) (also noted as P3HT), poly[N-9'-heptadecanyl-2,7-carbazole-alt-5,5-(4,7-di-2-thienyl-2',1',3'-benzothiadiazole] (also noted as PCDTBT), poly(p-phenylene-vinylene) (also noted as PPV), and alkoxy derivatives of poly(p-phenylene-vinylene), poly[2-methoxy-5-(3,7-dimethyloctyloxy)-1,4-phenylene-vinylene] (also noted as MDMO-PPV), poly[2-methoxy-5-(2-ethyl-hexyloxy)-1,4-phenylene-vinylene] (also noted as MEH-PPV), poly(2,5-dimethoxy-p-phenylene-vinylene) (also noted as PDMPV), poly(3,4-ethylenedioxythiophene) (also noted as PEDOT) and poly(3,4-ethylenedioxythiophene):poly(styrene sulfonate) (also noted as PEDOT:PSS), polyacetylene, polyphenylene, poly[2,6-(4,4-bis-(2-ethylhexyle)-4H-cyclopenta[2,1-b;3,4-b']-dithiophene)-alt-4,7-(2,1,3-benzothiadiazole)] (also noted as PCPDTBT), polyphenylacetylene, polydiphenylacetylene, polyaniline, polythiophene, poly(thienylenevinylene), poly(2,5-thienylenevinylene), polyfluorene, porphyrin macrocycles, thiol-derivatised polyporphyrins, polymetallocene, polyferrocene, polyphthalocyanin, polyvinylene, polyphenylvinylene, polysilane, polyisothianaphthalene, polythienylvinylene, derivatives of any of the materials of the list or a combination of the materials of the list. As an example of derivatives, the materials of the list comprise pendant groups, such as a cyclic ether, epoxy, oxetane, furane or cyclohexene oxide.

Optionally, the aforementioned polymers are conjugate polymers.

Alternatively, the derivatives of the aforementioned materials alternatively or additionally include other substituents. For example, the thiophene groups comprised in the aforementioned materials may comprise a phenyl group or an alkyl group, for example in position 3 of the thiophene ring. Examples of such thiophenes are thiophenes such that R3 is a $C_1$-$C_8$ alkyl group or a $C_1$-$C_6$ alkyl alkyl-C(=O)—O—$C_1$-$C_6$ alkyl group. The poly[3-(ethyl-4-butanoate)thiophene-2,5-diyl] is an example of such a thiophene. As another example, an alkyl, alkoxy, cyano, amino group, and/or hydroxy substituent groups may be present in any one of polyphenylacetylene, polydiphenylacetylene, polythiophene and poly(p-phenylene-vinylene).

According to another embodiment, the polymer is carbazole.

Preferably, the polymer is P3HT, PCDTBT or PTB7.

According to another embodiment, the organic semiconducting polymer of type n is selected as described in the article Facchetti, Antonio. "Polymer donor-polymer acceptor (all-polymer) solar cells" Materials Today 16, no. 4 (2013): 123-132.

At the end of the application of the addition step, a second mixture is obtained including the first organic semiconducting material of type n, the first organic semiconducting material of type p and an organic semiconducting polymer.

The second mixture has better solubility than the first mixture.

The solubility is a physical quantity designating the maximum molar concentration of the solute in the solvent, at a given temperature. The thereby obtained solution is then saturated. The solubility is measured by saturating the formulation, centrifuging and taking up the supernatant and measuring the absorbance of the formulation with a spectrophotometer, from which the concentration is inferred.

The materials are introduced with saturation in the solvent(s) and stirred at 50° C. at 900 rpm for 24 h. The test volumes will be set to 2 ml.

The mixtures are then centrifuged in order to recover the supernatant containing the material(s) which has(have) been solubilized. The supernatant is then analyzed after dilution by UV-Visible spectroscopy in order to determine the concentration of the material solubilized in the solvent.

The limiting concentration of materials in the first mixture is therefore less than the concentration of materials in the second mixture. The addition of the material for forming the second mixture gives the possibility of increasing the solubility of the second mixture and of having, for a same volume, more active materials while having better performances in terms of coating (wettability, roughness and homogeneity of the films) as shown in the table "Observation of the coating quality."

The second mixture has a higher viscosity than the mixtures of the state of the art.

The production method also includes a step for forming the organic film from the second mixture.

Preferably, the formation step is applied by using a roll-to-roll coating or printing technique.

Alternatively, the formation step is applied by using a slot-die coating technique.

According to another alternative, the formation step is applied by a screen printing method, a flexographic method or an inkjet method.

At the end of the formation step, a film is obtained.

The film obtained at the end of the formation step has better properties in terms of homogeneity, roughness and definition of the edges.

The obtained film also has improved homogeneity, resulting in a better internal structure, better morphology and better interface quality with the optional other layers with which the film will have to interact.

Further, the film has a wider absorption spectrum of incident light.

Further, obtaining the film does not involve the use of toxic or noxious solvents.

The film is therefore particularly suitable for obtaining an active layer of a photovoltaic cell having improved properties. The film may also be used for producing organic light-emitting diodes (also called OLEDs) or photodiodes.

Preferably, the second mixture consists in an organic semiconducting material of type n, an organic semiconducting material of type p and the polymer.

Advantageously, the polymer is a semiconducting polymer of type p or of type n.

Advantageously, in the second mixture, the mass ratio between the polymer and the organic semiconducting material of the same type is comprised between 0.8 and 1.2. In all the continuation of the description, by the expression of comprised between X and Y is meant that the relevant amount is greater than or equal to X on the one hand and less than or equal to Y on the other hand.

Preferably, in the second mixture, the mass ratio between the polymer and the first organic semiconducting material of the same type is comprised between 0.9 and 1.1.

Preferably, in the second mixture, the mass ratio between the polymer and the first organic semiconducting material of the same type is equal to 1.0.

Advantageously, in the second mixture, the mass ratio between the whole of the polymer and of the first organic semiconducting material of type p on the one hand and the organic semiconducting material of type n on the other hand is comprised between 0.8 and 1.2.

Preferably, in the second mixture, the mass ratio between the whole of the polymer and of the first organic semiconducting material of type p on the one hand and the organic semiconducting material of type n on the other hand is comprised between 0.9 and 1.5.

Preferably, in the second mixture, the mass ratio between the whole of the polymer and of the first organic semiconducting material of type p on the one hand and the organic semiconducting material of type n on the other hand is equal to 1.0.

According to an alternative, the second mixture includes a solvent or a solvent mixture, the solvent being a mixture of two compounds.

Advantageously, the absorption of at least one from among the organic semiconducting polymer and the first organic semiconducting material of same type is greater by 10% for an incident light wave having a wavelength comprised between 300 nm and 800 nm.

This gives the possibility of improving the absorption of the mixture on a wavelength comprised between 250 nm and 600 nm. The result of this is that the mixture has a wider absorption spectrum than the absorption spectrum of the organic semiconducting polymer alone or of the first organic semiconducting material of the same type alone.

Preferably, the absorption of at least one from among the organic semiconducting polymer and the first organic semiconducting material of same type is greater by 10% for an incident light wave having a wavelength comprised between 300 nm and 600 nm.

This gives the possibility of improving the absorption of the second mixture on a wavelength comprised between 100 nm and 600 nm. The result of this is that the second mixture has a wider absorption spectrum than the absorption spectrum of the organic semiconducting polymer alone or of the first organic semiconducting material of the same type, alone.

Thus, the method described earlier gives the possibility of resolving a technical contradiction which is to attain industrially viable processability parameters:
  reproducibility of the formulations (properties of the small molecules unlike the polymer which has much variability—chain length—causing unstable properties). Indeed, length of the chains and the variability of molar mass of the polymers actually causes unstable properties from batch to batch.
  film homogeneity of the formulations intended to be coated by roll-to-roll industrial methods. This property is intrinsic to the nature of the polymers. This property may be adjusted during steps for formulating the polymers. The viscosity gives the possibility of obtaining sharp contours required for manufacturing modules.

Both of these constraints are fulfilled while retaining optimum photoactive properties for producing electrically performing and therefore economically viable photovoltaic devices.

Adding the semiconducting photoactive polymer gave the possibility of solving this contradictory problem by improving the film homogeneity of a formulation based on small molecules while retaining and even improving the photoactive properties of the film.

Indeed, adding an insulating polymer such as polystyrene allows modification of the mechanical properties of a formulation, however this addition also has an impact on the electric properties of the mixture. Indeed, adding a material for forming a second mixture causes reorganization of the donor/acceptor lattice at the origin of the extraction of the charges.

The charge transport properties of semiconducting polymers are greater than the transport properties of an insulating polymer like polystyrene, but the modification of the equilibrium of the first mixture may lead to a variety of morphological modifications and to the reorganization of the donor/acceptor lattices and their electric properties are very difficult to predict.

In fact, an improvement in the solubility of the second mixture was observed: it was not expected that the addition of a semiconducting photoactive polymer would cause an improvement in the solubility and will allow addition of a material having as a consequence a potential increase in the extraction of the charges.

On the other hand, semiconducting photoactive polymers have complex molecular structures, notably with more or less long side chains, which also affect their solubility and their film homogeneity (the Hansen parameters explain the difficulty of solubilizing photoactive polymers). For more details relative to the Hansen parameters, please report to "Solubility parameters", Charles M. Hansen, Alan Beerbower, Kirk Othmer, supplement volume, pp. 889 à 8902é edition 1971; C. M. Hansen, Hansen Solubility Parameters: A User's Handbook, CRC Press, Boca Raton, Fla. 2000; and A. F. M. Barton, CRC handbook of solubility parameters and other cohesion parameters 2nd ed., CRC Press, Boca Raton, Fla. 1991.

The molecular interactions between the polymer chains, and therefore the intermolecular cohesion explain the degree of film homogeneity of the polymers.

Therefore, it is not surprising that by adding a photoactive semiconductor it is possible to adjust the viscosity and to adapt it to the specifications of the roll-to-roll coating methods.

The development of an industrializable coating method is actually the goal reached with the present method. This involves the use of non-chlorinated solvents and roll-to-roll methods as listed in the description which are fundamentally different from the spin coating methods used in the documents known from the state of the art.

Experiments

The experiments are conducted for a second mixture in which:
  the first material is DTS(FBTTH2)2, the polymer is P3HT, and
  the organic semiconducting material of type p is PCBM.

In the applied experiments, certain parameters are invariant:
  the ratio between donor and acceptor is a mass ratio of 1 for 1;
  the solvent ratio is 50% by mass of o-xylene for 50% by mass of 1-methyl naphthalene (Mna);
  the total donor concentration is 20 g·L$^{-1}$, and
  the formulation amount is 10 ml.

On the contrary, other parameters are variable in the following experiments, i.e.:
- the relative polymer mass proportion, the relative polymer mass proportion being defined as a ratio for which the numerator is the mass of the polymer in the second mixture and the denominator is the sum of the masses of the polymer and of the first material of the same type in the second mixture, and
- the relative first material mass proportion, the relative first material mass proportion being defined as a ratio for which the numerator is the mass of the first material in the second mixture and the denominator is the sum of the masses of the polymer and of the first material of the same type in the second mixture.

Five experiments are then applied for various relative polymer mass proportions (of the first material respectively):

| Experiments | Polymer (relative mass proportion in %) | First material (relative mass proportion in %) |
|---|---|---|
| 1 | 0 | 100 |
| 2 | 25 | 75 |
| 3 | 50 | 50 |
| 4 | 75 | 25 |
| 5 | 100 | 0 |

For each of the experiments, the mass composition of the second mixture is therefore the following:

| Experiments | First organic semiconducting material of type p | First organic semiconducting material of type n | Organic semiconducting polymer of type p | o-xylene | 1-methyl-naphthalene |
|---|---|---|---|---|---|
| 1 | 0.20 | 0.21 | 0.00 | 4.80 | 4.80 |
| 2 | 0.15 | 0.21 | 0.05 | 4.80 | 4.80 |
| 3 | 0.10 | 0.21 | 0.10 | 4.80 | 4.80 |
| 4 | 0.05 | 0.21 | 0.15 | 4.80 | 4.80 |
| 5 | 0.00 | 0.21 | 0.21 | 4.80 | 4.80 |

For each of the experiments, the operating procedure comprises the following operations:
1) weighing the organic semiconducting material of type n (PCBM) and the solvents in 20 ml glass vials,
2) mixing the organic semiconducting material of type n and the solvents,
3) starting stirring of the obtained mixture at the end of step 2) at 900 rpm for 3 hours at 60° C.,
4) weighing and adding the first material of type p (DTS(FBTTH2)2),
5) preparing the first mixture,
6) weighing and adding the semiconducting polymer of type p (P3HT),
7) obtaining the second mixture,
8) starting stirring of the second mixture at 900 rpm for 18 hours at 60° C.,
9) observing the solubility of the second mixture with the naked eye,
10) rheological measurements applied while keeping the second mixture in an oven at 30° C., the measurements being carried out with a RheoStress Rheometer, the viscosity being analyzed with the C35/0.5° cone. The viscosity is measured for several speeds of rotation of the apparatus, i.e. 500 $s^{-1}$, 1,000 $s^{-1}$ or 10,000 $s^{-1}$,
11) coating the second mixture on ITO and PET at a temperature of 40° C. and at a speed of 40 mm/s by using an automatic film applicator or a doctor-blade provided with a 12.5 µm slot,
12) drying applied at the temperature of 80° C.,
13) observing the quality of the coating with the naked eye, and
14) measuring the absorbance of the layer on a UV-Visible spectrophotometer.

The following table summarizes the results obtained for the characteristics relating to the viscosity of the second mixture:

| Experiments | Solubility observed visually during step 9) | Viscosity of the second mixture in mPa · s for a speed of rotation of the RheoStress Rheometer of | | |
|---|---|---|---|---|
| | | 500 $s^{-1}$ | 1,000 $s^{-1}$ | 10,000 $s^{-1}$ |
| 1 | Good | 1.1 | 1.1 | 1.2 |
| 2 | Good | 1.6 | 1.6 | 1.7 |
| 3 | Good | 2.2 | 2.2 | 2.3 |
| 4 | Good | 2.8 | 2.8 | 3.0 |
| 5 | Good | 3.5 | 3.6 | 3.7 |

It appears that the second mixtures using a solvent based on o-xylene/1-methylnaphthalene have very good solubility.

It is also observable that addition of the polymer increases the viscosity.

The following table summarizes the results obtained for the properties relating to the coating of the second mixture:

| | Observations of the quality of the coating | |
|---|---|---|
| Experiments | on PET | on ITO |
| 1 | Homogenous coating Presence of agglomerates | Homogenous coating Presence of agglomerates |
| 2 | Homogenous coating A few agglomerates | Homogenous coating A few agglomerates |
| 3 | Homogenous coating A few agglomerates | Homogenous coating A few agglomerates |
| 4 | Homogenous coating A few agglomerates | Homogenous coating A few agglomerates |
| 5 | Homogenous coating Absence of agglomerates | Homogenous coating Absence of agglomerates |

It appears that the films obtained from the first mixture have the most agglomerates due to the low solubility of the materials of the first mixture.

It is also observable that the iso-mass formulation of the first material and of the polymer corresponds to the best performances in terms of coating: wettability of the mixtures, roughness and homogeneity of the films.

What is claimed is:
1. A production method for producing a semiconducting organic film comprising the steps:
preparing a first mixture comprising a first organic semiconducting material of type p having a molar mass of less than or equal to 2,000 g·$mol^{-1}$ and a first organic semiconducting material of type n having a molar mass of less than or equal to 2,000 g·mol$^{-1}$, adding a second organic semiconducting material to the first mixture to form a second mixture, wherein the second organic semiconducting material is one or more conjugated polymers having a molar mass greater than or equal to 10,000 g·mol$^{-1}$, and forming the organic film from the second mixture.

2. The method according to claim 1, wherein the second organic semiconducting material is an organic semiconducting polymer of type n or an organic semiconducting polymer of type p.

3. The method according to claim 2, wherein in the second mixture has a mass ratio of the second organic semiconducting material to the first organic semiconducting material of the same type that of second organic semiconducting material that is between 0.8 and 1.2.

4. The method according to claim 2, wherein in the second mixture has a mass ratio of the second organic semiconducting material to the first organic semiconducting material of the same type that of second organic semiconducting material that is between 0.9 and 1.1.

5. The method according to claim 2, wherein in the second mixture has a mass ratio of the second organic semiconducting material to the first organic semiconducting material of the same type that of second organic semiconducting material that is 1.0.

6. The method according to claim 1, wherein the second mixture has a mass ratio of the sum of the second organic semiconducting material, which is of type n, and the first organic semiconducting material of type n to the first organic semiconducting material of type p that is between 0.8 and 1.2.

7. The method according to claim 1, wherein the first mixture further comprises a solvent or a mixture of solvents.

8. The method according to claim 7, wherein the second mixture is more soluble than the first mixture in the solvent or mixture of solvents.

9. The method according to claim 1, wherein the second mixture has a viscosity of more than 2 mPa·s.

10. The method according to claim 1, wherein the organic film is formed using a coating technique or a printing technique, wherein the coating technique is selected from the group consisting of slot-die coating, slide coating, dip coating, curtain coating, knife coating, doctor blading, and spin coating, and the printing technique is selected from the group consisting of flexography, heliography, heliogravure, offset printing, ink jet printing, screen printing, and roll-to-roll printing.

11. An organic film produced by a method comprising:
preparing a first mixture comprising a first organic semiconducting material of type p having a molar mass of less than or equal to 2,000 g·mol$^{-1}$ and a first organic semiconducting material of type n having a molar mass of less than or equal to 2,000 g·mol$^{-1}$, adding a second organic semiconducting material to the first mixture to form a second mixture, wherein the second organic semiconducting material is one or more conjugated polymers having a molar mass greater than or equal to 10,000 g·mol$^{-1}$, and forming the organic film from the second mixture.

12. An organic photovoltaic cell comprising an active layer, wherein the active layer is an organic film produced by a method comprising:
preparing a first mixture comprising a first organic semiconducting material of type p having a molar mass of less than or equal to 2,000 g·mol$^{-1}$ and a first organic semiconducting material of type n having a molar mass of less than or equal to 2,000 g·mol$^{-1}$, adding a second organic semiconducting material to the first mixture to form a second mixture, wherein the second organic semiconducting material is one or more conjugated polymers having a molar mass greater than or equal to 10,000 g·mol$^{-1}$, and forming the organic film from the second mixture.

13. An organic photovoltaic module comprising at least two organic photovoltaic cells connected in series or parallel, wherein each such organic photovoltaic cell comprises an active layer, wherein the active layer is an organic film produced by a method comprising:
preparing a first mixture comprising a first organic semiconducting material of type p having a molar mass of less than or equal to 2,000 g·mol$^{-1}$ and a first organic semiconducting material of type n having a molar mass of less than or equal to 2,000 g·mol$^{-1}$, adding a second organic semiconducting material to the first mixture to form a second mixture, wherein the second organic semiconducting material is one or more conjugated polymers having a molar mass greater than or equal to 10,000 g·mol$^{-1}$, and forming the organic film from the second mixture.

14. A method for manufacturing an active layer of an organic photovoltaic cell of a photovoltaic module, the method comprising coating a substrate with strips of an organic film produced by a method comprising:
preparing a first mixture comprising a first organic semiconducting material of type p having a molar mass of less than or equal to 2,000 g·mol$^{-1}$ and a first organic semiconducting material of type n having a molar mass of less than or equal to 2,000 g·mol$^{-1}$, adding a second organic semiconducting material to the first mixture to form a second mixture, wherein the second organic semiconducting material is one or more conjugated polymers having a molar mass greater than or equal to 10,000 g·mol$^{-1}$, and forming the organic film from the second mixture.

* * * * *